(12) United States Patent
Asai et al.

(10) Patent No.: US 12,051,560 B2
(45) Date of Patent: Jul. 30, 2024

(54) ION GUN AND ION MILLING MACHINE

(71) Applicant: Hitachi High-Tech Corporation, Tokyo (JP)

(72) Inventors: Kengo Asai, Tokyo (JP); Hisayuki Takasu, Tokyo (JP); Toru Iwaya, Tokyo (JP); Tsutomu Tetsuka, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 357 days.

(21) Appl. No.: 17/634,331

(22) PCT Filed: Aug. 28, 2019

(86) PCT No.: PCT/JP2019/033713
§ 371 (c)(1),
(2) Date: Feb. 10, 2022

(87) PCT Pub. No.: WO2021/038754
PCT Pub. Date: Mar. 4, 2021

(65) Prior Publication Data
US 2022/0285123 A1    Sep. 8, 2022

(51) Int. Cl.
*H01J 37/08*     (2006.01)
*H01J 37/18*     (2006.01)
(Continued)

(52) U.S. Cl.
CPC ............. *H01J 37/08* (2013.01); *H01J 37/18* (2013.01); *H01J 37/20* (2013.01); *H01J 37/3244* (2013.01); *H01J 2237/082* (2013.01)

(58) Field of Classification Search
CPC .. H01J 37/08; H01J 37/18; H01J 37/20; H01J 37/3244; H01J 37/3056; H01J 2237/061;
(Continued)

(56) References Cited

U.S. PATENT DOCUMENTS

| | | |
|---|---|---|
| 4,423,355 A | 12/1983 | Kageyama |
| 7,619,224 B2 | 11/2009 | Chen et al. |

(Continued)

FOREIGN PATENT DOCUMENTS

| | | |
|---|---|---|
| CN | 105340051 A | 2/2016 |
| JP | S53114661 A | 10/1978 |

(Continued)

OTHER PUBLICATIONS

Search Report mailed Nov. 19, 2019 in International Application No. PCT/JP2019/033713.
(Continued)

*Primary Examiner* — David E Smith
*Assistant Examiner* — Hsien C Tsai
(74) *Attorney, Agent, or Firm* — Miles & Stockbridge, P.C.

(57) ABSTRACT

Provided is an ion gun that is capable of obtaining a higher plasma efficiency. This ion gun comprises: a first cathode 21 that is formed in a disc shape; a second cathode 12 that is formed in a disc shape and has an ion beam extraction hole 101*a* provided thereto; a first permanent magnet 14 that is disposed between the first cathode and the second cathode, and that is formed in a cylindrical shape; an anode 23 that has a cylindrical region 35*a* and an extending region 25*a* provided to one end of the cylindrical region; and an insulating material 26 that keeps the anode electrically insulated from the first cathode, the second cathode, and the first permanent magnet, all of which are electrically connected. The cylindrical region of the anode is disposed inside the inner diametrical position of the first permanent magnet, and the extending region of the anode is disposed so as to cross over the inner diametrical position of the first permanent magnet and to face the first cathode.

19 Claims, 11 Drawing Sheets

(51) Int. Cl.
*H01J 37/20* (2006.01)
*H01J 37/32* (2006.01)

(58) Field of Classification Search
CPC ......... H01J 2237/082; H01J 2237/0815; H01J 2237/3151; H01J 27/04
See application file for complete search history.

(56) References Cited

U.S. PATENT DOCUMENTS

| | | | |
|---|---|---|---|
| 10,304,653 | B2 | 5/2019 | Asai et al. |
| 2005/0232320 | A1 | 10/2005 | Tateno |
| 2006/0076510 | A1 | 4/2006 | Chang et al. |
| 2006/0284105 | A1 | 12/2006 | Yamashita et al. |
| 2007/0221871 | A1 | 9/2007 | Callahan et al. |
| 2009/0321657 | A1 | 12/2009 | Satoh et al. |
| 2010/0055345 | A1 | 3/2010 | Biloiu et al. |
| 2010/0143198 | A1 | 6/2010 | Damiano, Jr. et al. |
| 2011/0248179 | A1* | 10/2011 | Matesa, Jr. ............. H01J 27/04 250/396 ML |
| 2011/0259269 | A1 | 10/2011 | Biloiu et al. |
| 2012/0025072 | A1 | 2/2012 | Toyoda et al. |
| 2012/0286175 | A1 | 11/2012 | Searle et al. |
| 2013/0094991 | A1 | 4/2013 | Nagata et al. |
| 2016/0126057 | A1 | 5/2016 | Kaneko et al. |
| 2016/0148782 | A1 | 5/2016 | Agemura et al. |
| 2017/0221671 | A1 | 8/2017 | Asai et al. |
| 2017/0221677 | A1* | 8/2017 | Asai .................... H01J 37/3053 |
| 2018/0286633 | A1 | 10/2018 | Asai et al. |
| 2019/0237291 | A1 | 8/2019 | Asai et al. |

FOREIGN PATENT DOCUMENTS

| | | | |
|---|---|---|---|
| JP | 2000355764 A | 12/2000 | |
| JP | 2006351374 A | 12/2006 | |
| JP | 2007048588 A | 2/2007 | |
| JP | 2012033335 A | 2/2012 | |
| JP | 2012156077 A | 8/2012 | |
| JP | 2013524467 A | 6/2013 | |
| JP | 2014235948 A | 12/2014 | |
| JP | 2016031870 A | 3/2016 | |
| TW | 201517111 A | 5/2015 | |
| WO | WO-2014196262 A1 * | 12/2014 | ............ H01J 27/146 |
| WO | 2016017661 A1 | 2/2016 | |
| WO | 2017051469 A1 | 3/2017 | |

OTHER PUBLICATIONS

Written Opinion mailed Nov. 19, 2019 in International Application No. PCT/JP2019/033713.
Office Action mailed Apr. 16, 2021 in Taiwanese Application No. 109123322.
Office Action mailed Sep. 28, 2018 in U.S. Appl. No. 15/500,392.
Office Action mailed Jun. 19, 2018 in Japanese Applicaton No. 2017-189451.
Office Action mailed Jan. 30, 2018 in U.S. Appl. No. 15/500,392.
Search Report mailed Oct. 13, 2015 in International Application No. PCT/JP2015/071432.
Written Opinion mailed dated Oct. 13, 2015 in International Application No. PCT/JP2015/071433.
Office Action mailed Oct. 6, 2017 in U.S. Appl. No. 15/500,392.
Office Action mailed Mar. 3, 2021 in U.S. Appl. No. 16/381,938.

* cited by examiner

[FIG. 1]
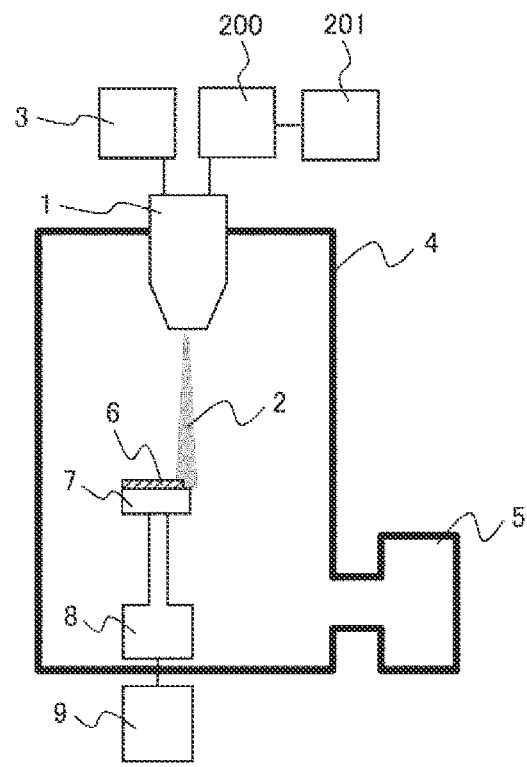
[FIG. 2]
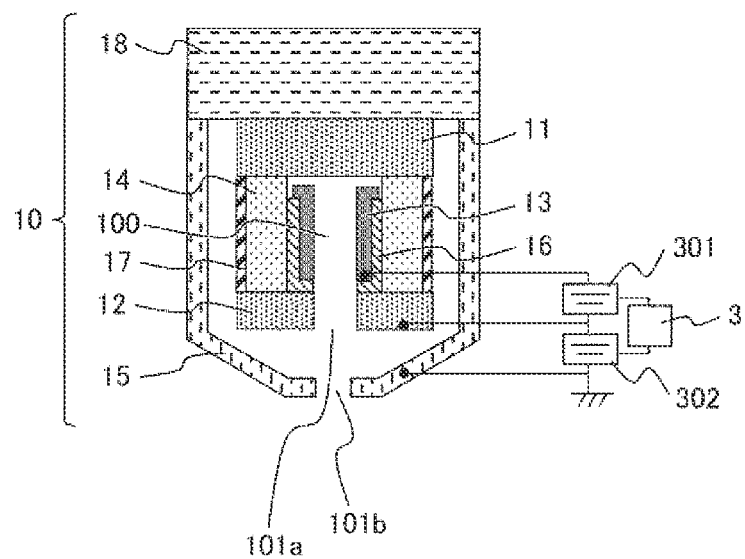

[FIG. 3]
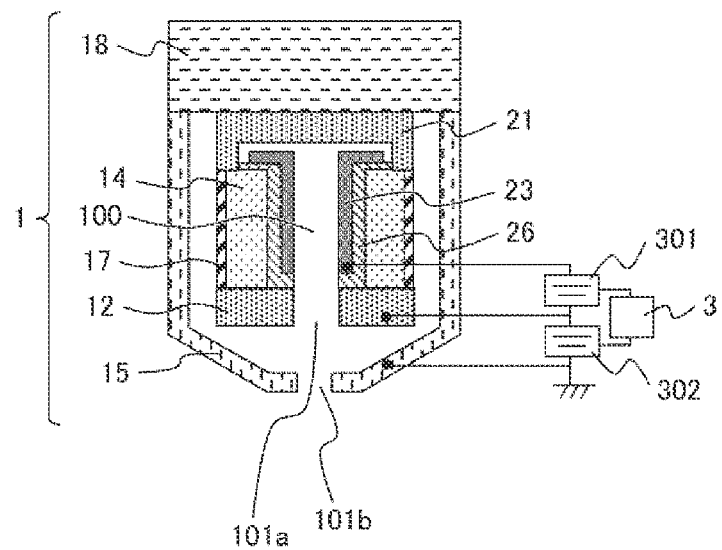
[FIG. 4]
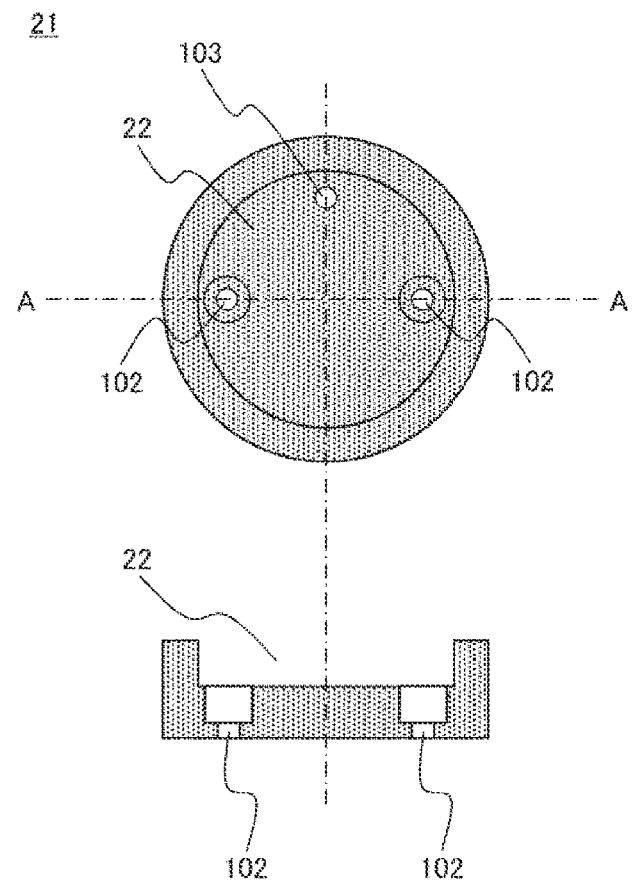

[FIG. 5]
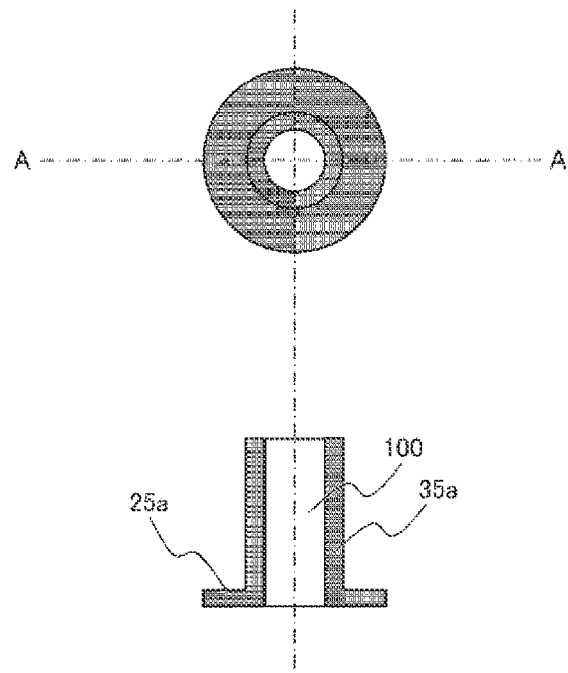
[FIG. 6]
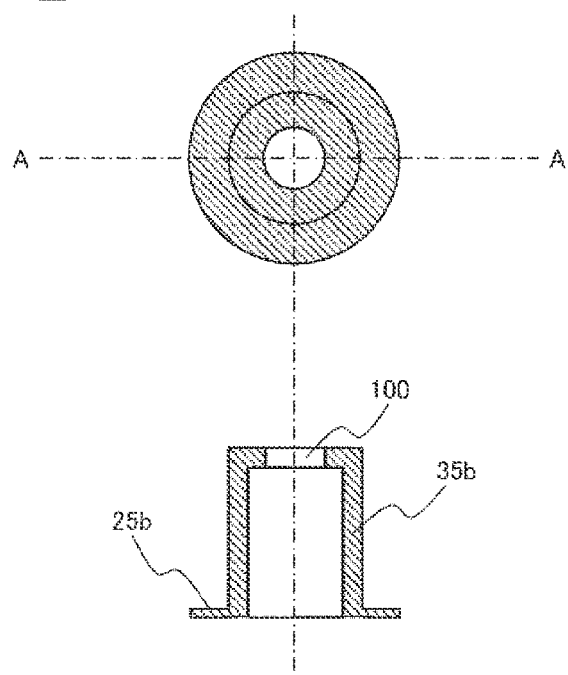

[FIG. 7]
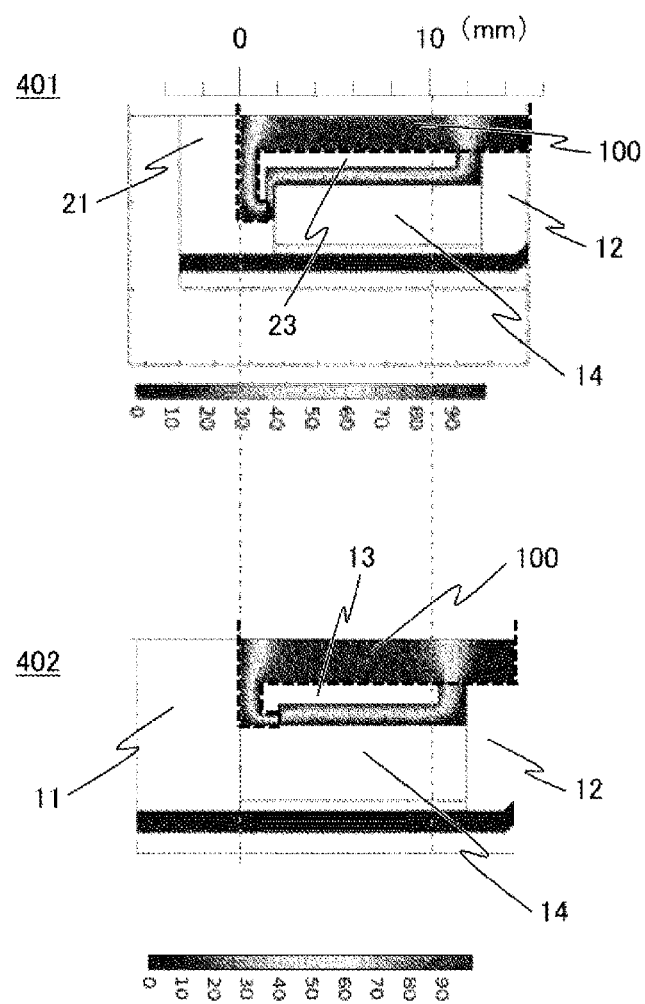

[FIG. 8A]
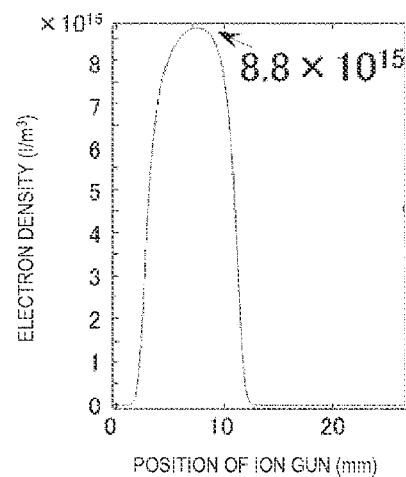
[FIG. 8B]
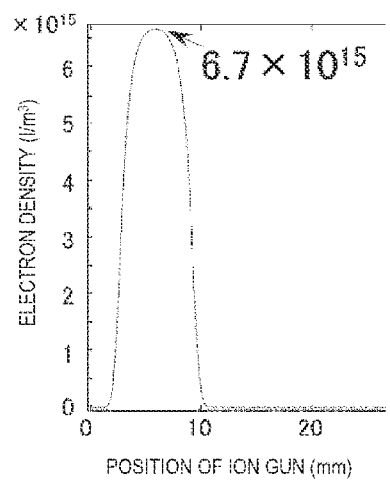

[FIG. 9]
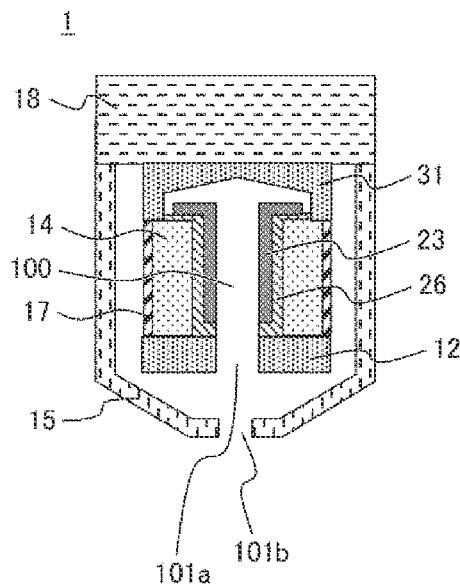
[FIG. 10]
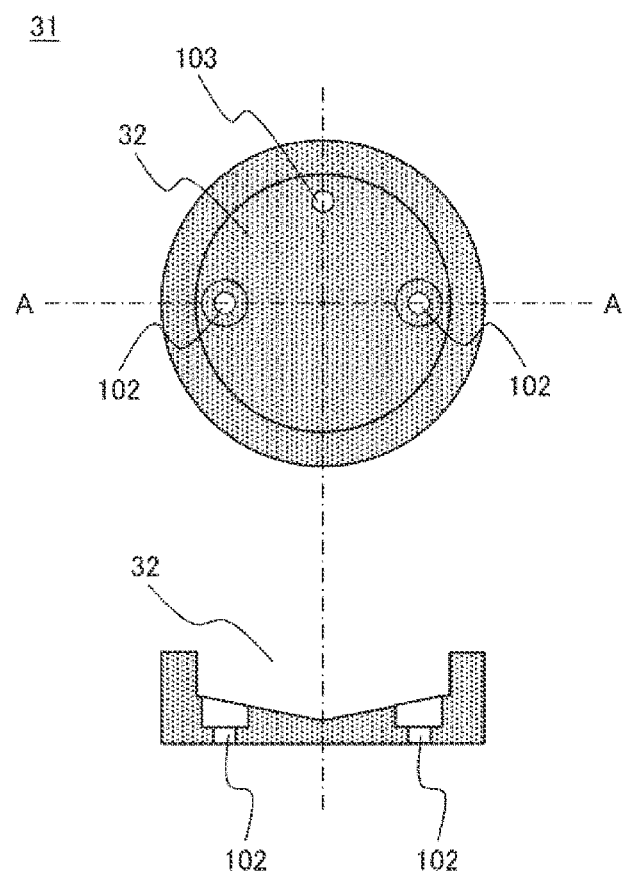

[FIG. 11]
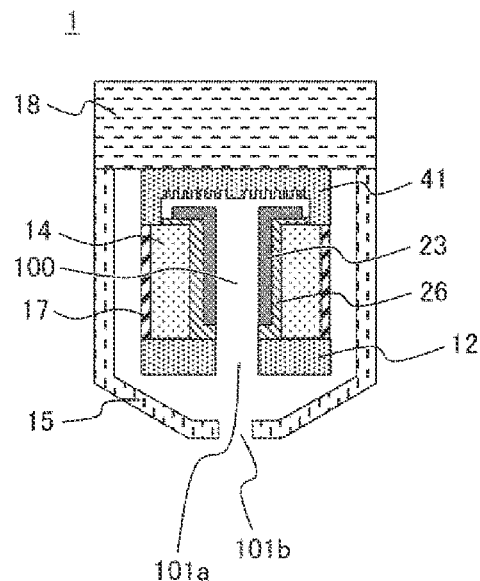
[FIG. 12]
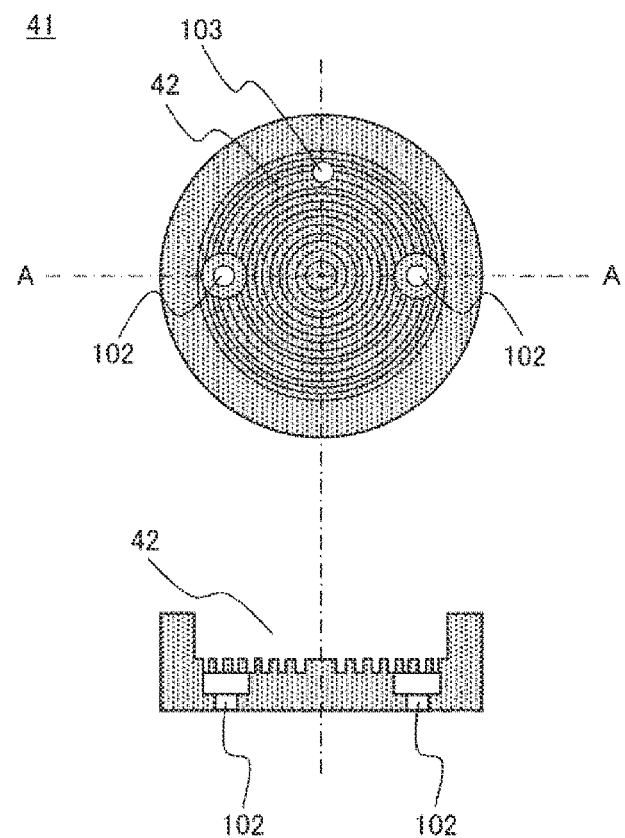

[FIG. 13]
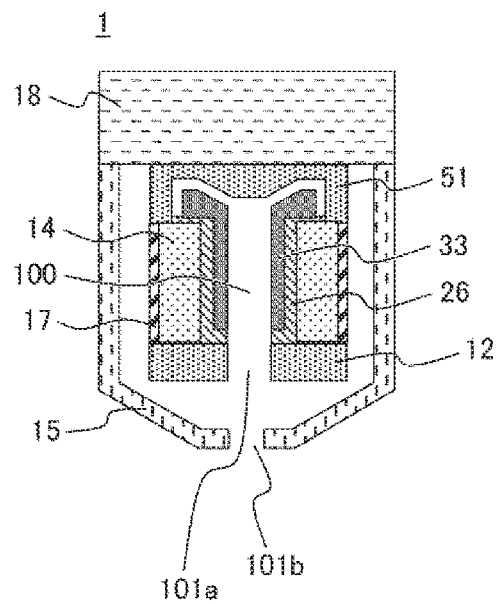
[FIG. 14]
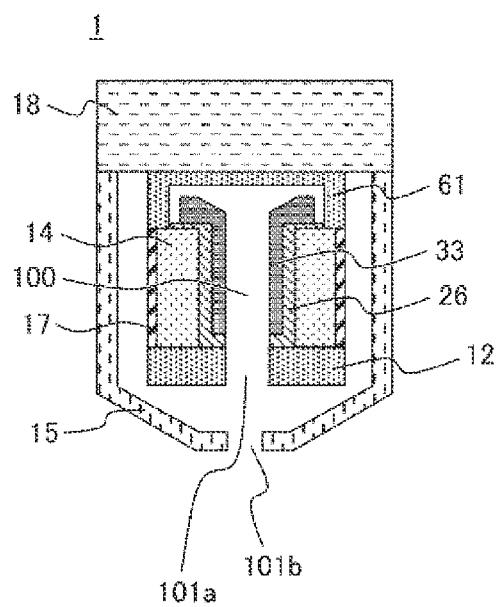

[FIG. 15]
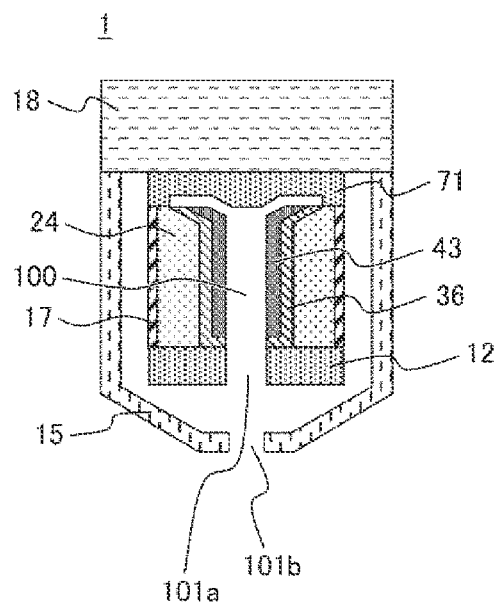
[FIG. 16]
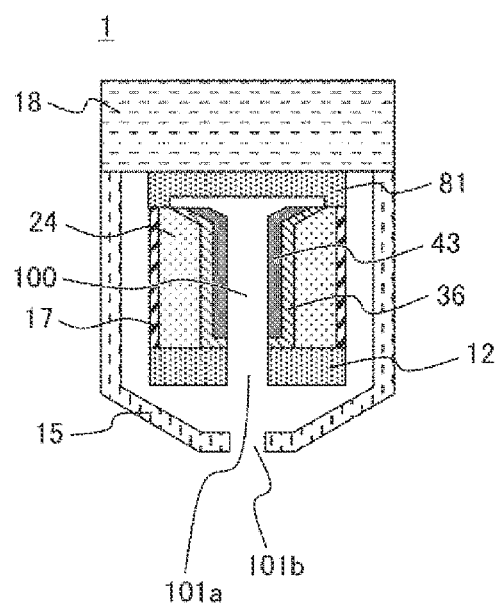

[FIG. 17]
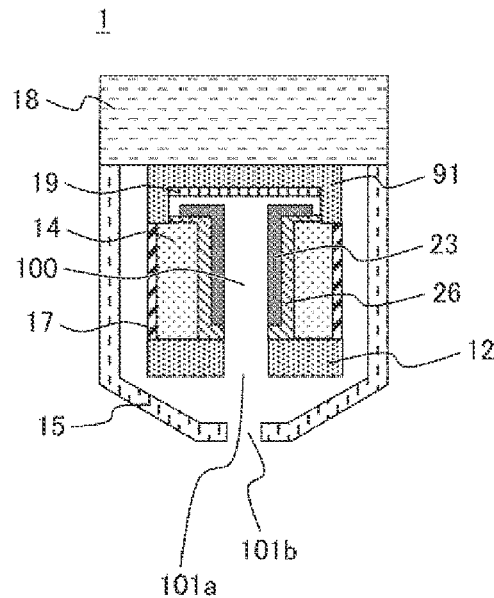
[FIG. 18]
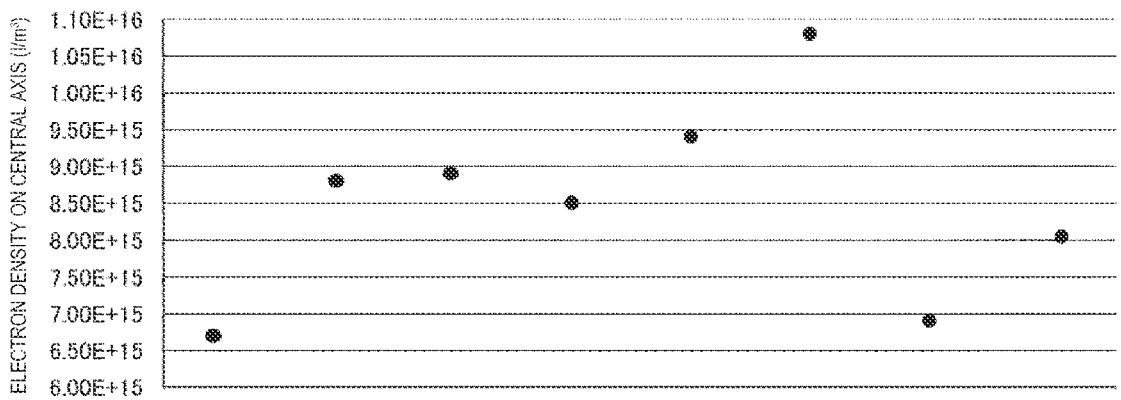

[FIG. 19]
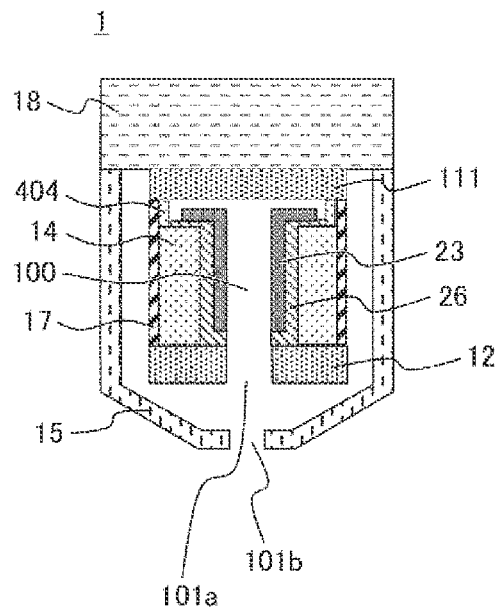
[FIG. 20]
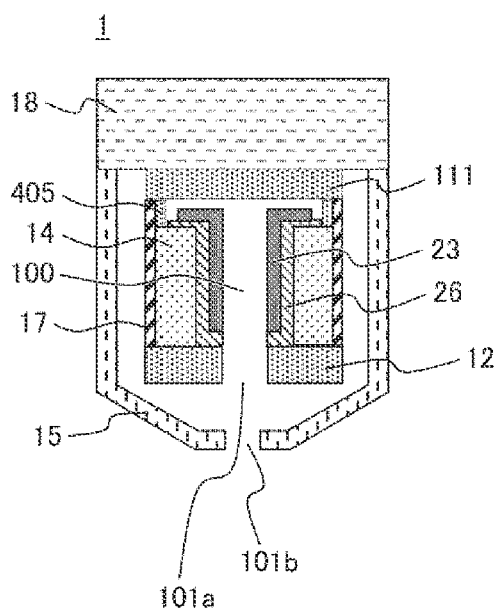

ION GUN AND ION MILLING MACHINE

TECHNICAL FIELD

The present invention relates to an ion gun of Penning discharge and an ion milling device including the same.

BACKGROUND ART

An ion milling method is a processing method in which accelerated ions collide with a sample and the sample is scraped by utilizing a sputtering phenomenon in which ions repel atoms and molecules. A smooth cross section can be obtained by placing a mask that is a shielding plate for ion beams on an upper surface of the sample to be processed and sputtering a protruding portion from an end surface of the mask. For example, when acquiring a morphological image, a sample composition image, or a channeling image, and performing X-ray analysis, crystal orientation analysis, or the like by a scanning electron microscope for the purpose of analyzing an internal structure, a cross-sectional shape, a film thickness evaluation, a crystal state, a failure, or a foreign matter cross section of an electronic component, the processing method is useful for producing a cross-sectional sample. The processing method is not only applicable to electronic components, but also applicable to metal, glass, ceramics, composite materials, and the like.

In an ion milling device that prepares a sample before observation analysis by an electron microscope, a small-sized ion gun of Penning discharge having a relatively simple configuration is widely used as an ion gun. PTL 1 discloses a basic structure of an ion gun of Penning discharge. PTL 2 discloses a method for optimizing a magnetic field generated by a permanent magnet and an ionization chamber region in an ion gun of Penning discharge to increase the number of ions emitted from the ion gun.

CITATION LIST

Patent Literature

PTL 1: JP-A-S53-114661
PTL 2: JP-A-2016-31870

SUMMARY OF INVENTION

Technical Problem

With the progress of ion milling devices in recent years, a market of ion milling devices is widely expanded and there is a demand for improved processing speed. For example, in a three-dimensional mounting analysis of a through silicon via (TSV) in which a thickly stacked sample needs to be processed in a semiconductor field, a composition analysis of a steel material having a high hardness in a material field, or the like, processing time is long in the related art, which lowers an operating rate of the device.

In an ion gun of Penning discharge, electrons emitted from a cathode undergo a swirling motion under the effect of a magnetic field and are ionized when the electrons collide with a gas introduced into the ion gun. The ion gun has such a feature that, by arranging cathodes having the same potential at both ends of an anode, electrons reciprocate between the cathodes and their orbits can be lengthened, thereby improving the ionization efficiency. A part of the generated cations pass through an ion beam extraction hole of one of the cathodes, are accelerated by an acceleration electrode, and are discharged to the outside from an ion beam extraction hole of the acceleration electrode. To achieve a higher processing speed, it is necessary to increase the number of ions emitted from the ion gun.

However, even when an acceleration voltage is increased in order to increase the processing speed (for example, the acceleration voltage is increased from 7 kV to 8 kV), an ion beam current value is not increased. As a result, the processing speed is found not increased.

Solution to Problem

An ion gun according to one aspect of the invention includes: a first cathode formed in a disk shape; a second cathode formed in a disk shape and provided with ion beam extraction holes; a first permanent magnet disposed between the first cathode and the second cathode and formed in a cylindrical shape; an anode including a cylindrical region and a protruding region provided at one end of the cylindrical region; and an insulator electrically insulating the anode from the first cathode, the second cathode, and the first permanent magnet that are electrically connected, in which the cylindrical region of the anode is disposed inside an inner diameter position of the first permanent magnet, and the protruding region of the anode is disposed beyond the inner diameter position of the first permanent magnet and faces the first cathode.

An ion milling device according to another aspect of the present invention is an ion milling device including such an ion gun.

Advantageous Effect

An ion gun capable of achieving a higher plasma efficiency or an ion milling device capable of achieving a higher processing speed is provided.

Other problems and novel characteristics will become apparent from a description of the present specification and the accompanying drawings.

BRIEF DESCRIPTION OF DRAWINGS

FIG. 1 is a diagram of a configuration of an ion milling device.

FIG. 2 is a cross-sectional view of a configuration of an ion gun having a structure in the related art (a comparative example).

FIG. 3 is a cross-sectional view of a configuration of an ion gun according to the present embodiment (a first embodiment).

FIG. 4 is a diagram showing a shape of a first cathode 21.

FIG. 5 is a diagram showing a shape of an anode 23.

FIG. 6 is a diagram showing a shape of an insulator 26.

FIG. 7 is a diagram showing an analysis result of potential distribution inside an ion gun.

FIG. 8A is a diagram showing electron density distribution inside a plasma generation chamber according to the present embodiment.

FIG. 8B is a diagram showing electron density distribution inside a plasma generation chamber according to the comparative example.

FIG. 9 is a cross-sectional view of a configuration of an ion gun according to the present embodiment (a second embodiment).

FIG. 10 is a diagram showing a shape of a first cathode 31.

FIG. 11 is a cross-sectional view of a configuration of an ion gun according to the present embodiment (a third embodiment).

FIG. 12 is a diagram showing a shape of a first cathode 41.

FIG. 13 is a cross-sectional view of a configuration of an ion gun according to the present embodiment (a fourth embodiment).

FIG. 14 is a cross-sectional view of a configuration of an ion gun according to the present embodiment (a fifth embodiment).

FIG. 15 is a cross-sectional view of a configuration of an ion gun according to the present embodiment (a sixth embodiment).

FIG. 16 is a cross-sectional view of a configuration of an ion gun according to the present embodiment (a seventh embodiment).

FIG. 17 is a cross-sectional view of a configuration of an ion gun according to the present embodiment (an eighth embodiment).

FIG. 18 is a diagram showing electron density distribution in the plasma generation chamber according to the comparative example and in plasma generation chambers according to the present embodiment.

FIG. 19 is a cross-sectional view of a configuration of an ion gun according to the present embodiment (a ninth embodiment).

FIG. 20 is a cross-sectional view of a configuration of an ion gun according to the present embodiment (a tenth embodiment).

DESCRIPTION OF EMBODIMENTS

Hereinafter, embodiments of the invention will be described with reference to the drawings.

FIG. 1 shows a configuration of an ion milling device. An ion gun 1 of Penning discharge includes elements necessary for generating ions inside, and constitutes an irradiation system that irradiates a sample 6 with an ion beam 2. A gas source 201 is connected to the ion gun 1 via a gas supply mechanism 200, and a gas flow controlled by the gas supply mechanism 200 is supplied into a plasma generation chamber of the ion gun 1. The gas supply mechanism 200 includes components for adjusting the flow of ionized gas and supplying the ionized gas into the ion gun. As an example, Ar gas is used as the introduced gas.

The irradiation with the ion beam 2 and an ion beam current thereof are controlled by an ion gun controller 3. A vacuum chamber 4 is controlled to be under atmospheric pressure or be vacuum by a vacuum exhaust system 5. The sample 6 is held on a sample table 7. The sample table 7 is held by a sample stage 8. The sample stage 8 may be pulled out of the vacuum chamber 4 when the vacuum chamber 4 is opened to the atmosphere, and may include a mechanism for tilting the sample 6 at any angle with respect to an optical axis of the ion beam 2. A sample stage driver 9 may swing the sample stage 8 to left and right and control a speed of the sample stage 8.

FIG. 2 shows a structure (cross-sectional view) of an ion gun of Penning discharge in the related art as a comparative example. The structure and operation of the ion gun will be described. A first cathode 11 is formed of a conductive magnetic material such as pure iron and has a disk shape. The first cathode 11 is provided with a hole for introducing a gas into a plasma generation chamber 100, and a hole through which an anode pin (not shown) for supplying power to an anode 13 passes. Similarly, a second cathode 12 has a disk shape and is formed of a conductive magnetic material such as pure iron, and is provided with an ion beam extraction hole 101a in a central portion thereof. A permanent magnet 14 is, for example, a samarium cobalt magnet, and is formed in a cylindrical shape. One end of the permanent magnet 14 is connected to the first cathode 11 and the other end thereof is connected to the second cathode 12. A magnetic field is generated in the ion gun 1 by the first cathode 11, the second cathode 12, and the permanent magnet 14. A cathode ring 17 is provided to not expose the permanent magnet 14 to the environment. The cathode ring 17 is formed of a material such as stainless steel.

A cylindrical insulator 16 is disposed inside the permanent magnet 14. An outer surface of the insulator 16 is in contact with an inner wall of the permanent magnet 14. The insulator 16 is formed of an electrically insulating non-magnetic material such as ceramics. The anode 13 is fitted inside the insulator 16. An outer surface of the anode 13 is in contact with an inner surface of the insulator 16, and an inner surface of the anode 13 faces the plasma generation chamber 100. The anode 13 is formed of, for example, an electrically conductive non-magnetic material such as aluminum. The anode 13 is electrically insulated from the first cathode 11, the second cathode 12, and the permanent magnet 14 by the insulator 16.

An acceleration electrode 15 is formed in a cylindrical shape by an electrically conductive non-magnetic material such as stainless steel, and is provided with an ion beam extraction hole 101b in a central portion thereof. The acceleration electrode 15 maintained at a ground potential is fixed to a peripheral portion of an ion gun base 18 to surround the first cathode 11, the second cathode 12, and the permanent magnet 14. A hole is provided in the ion gun base 18 and the first cathode 11. For example, Ar gas introduced from a gas introduction mechanism is introduced into the plasma generation chamber 100.

The Ar gas introduced into the plasma generation chamber 100 is maintained at an appropriate gas partial pressure, and a discharge voltage of about 2 kV is applied between the first cathode 11 as well as the second cathode 12 (the first cathode 11 and the second cathode 12 are electrically connected via the permanent magnet 14 and are maintained at the same potential) and the anode 13 by a discharge power supply 301 to cause a glow discharge. Electrons emitted from a surface of the first cathode 11 and a surface of the second cathode 12 are accelerated toward the anode 13 by applying the discharge voltage, and trajectories of the emitted electrons are bent into a swirling motion by the magnetic field formed in the plasma generation chamber 100 by the first cathode 11, the second cathode 12, and the permanent magnet 14. Since the trajectories of the electrons become longer due to the swirling motion, the discharge efficiency is improved.

When the electrons swirling in the plasma generation chamber 100 collide with the introduced Ar gas, the Ar gas subjected to the collision is ionized, and Ar ions (cations) are generated in the plasma generation chamber 100. A part of the cations generated in the plasma generation chamber 100 pass through the ion beam extraction hole 101a of the second cathode 12, are accelerated by being supplied with an acceleration voltage of about 10 kV between the second cathode 12 and the acceleration electrode 15 by an acceleration power supply 302, and are discharged to the outside of the ion gun 10 from the ion beam extraction hole 101b of the acceleration electrode. A sample is processed by an ion beam including cations.

An ion current extracted from the ion gun of Panning discharge is limited to space charges because an electric field changes due to the space charges of ions. Ion flows supplied by the ion gun are also limited. In general, the balance between an extraction system and a plasma condition for generating ions is maintained by setting a space charge limiting current value and an ion saturation current value to the same value, so that a large quantity of high-quality ion beams can be extracted. To increase the ion saturation current value, electron temperature and plasma density inside the plasma generation chamber 100 may be increased. To increase the space charge limiting current value, the acceleration voltage applied between the cathode 12 and the acceleration electrode 15 may be increased.

As mentioned above, a reason why an ion beam current value extracted from the ion gun does not increase even when the acceleration voltage is increased is that the ion saturation current value of the ion gun does not reach a value corresponding to the space charge limiting current value, that is, a sufficient ion flow fails to be generated in the plasma generation chamber 100. In the generation of ion flows, it is necessary to combine a permanent magnet having an appropriate magnetic flux density with a plasma generation chamber region capable of supplying sufficient electrons. To implement an ion gun suitable for an ion milling device having a higher processing rate, the present embodiment provides an ion gun capable of implementing an ion saturation current value corresponding to a space charge limiting current value when a higher acceleration voltage is applied by increasing a supply quantity of electrons generated in a plasma generation chamber as compared with a supply quantity of electrons in the structure in the related art, and an ion milling device including the ion gun.

FIG. 3 is a cross-sectional view of a configuration of an ion gun according to the present embodiment (a first embodiment). The same components as those of the ion gun shown in the comparative example are denoted by the same reference numerals with descriptions thereof omitted, and the description will be focused on configurations different from those of the comparative example. The same applies to the following embodiments. To achieve a high ion saturation current in the ion gun of Penning discharge, it is necessary to increase the supply amount of electrons. Accordingly, an area of the first cathode 21 that supplies electrons exposed to the plasma generation chamber 100 is expanded.

Specifically, the first cathode 21 and the anode 23 face each other outside an inner diameter position of the permanent magnet 14. A recess portion having a diameter smaller than an outer diameter of the permanent magnet 14 and larger than an inner diameter of the permanent magnet 14 is formed on a surface of the first cathode 21 on which the first cathode 21 is connected to the permanent magnet 14. The region where the first cathode 21 and the anode 23 face each other is expanded by providing a disk shape protruding region at an end portion of the anode 23 on a side where the anode 23 faces the first cathode 21 and expanding the area. The insulator 26 that electrically insulates the first cathode 21, the second cathode 12, and the permanent magnet 14 from the anode 23 has the same shape as the anode 23 and is coated such that the permanent magnet 14 is not exposed to the plasma generation chamber 100, thereby improving the reliability of the ion gun.

FIG. 4 shows a shape of the first cathode 21. FIG. 4 shows a plan view (upper view) of the first cathode 21 viewed from an ion beam extraction hole side, and a cross-sectional view (lower view) of the first cathode 21 along an A-A line in the plan view. The first cathode 21 is formed of a conductive magnetic material such as pure iron and has a disk shape. The first cathode 21 is provided with cathode fixing holes 102 for fixing the cathode to the ion gun base 18. An anode pin through hole 103 through which an anode pin for supplying power to the anode 23 passes is provided. The ion gun base 18 is also provided with a through hole at a position corresponding to the anode pin through hole 103, and the anode pin is inserted into the plasma generation chamber 100 through the through holes of the ion gun base 18 and the first cathode 21. In the present embodiment, for example, a recess portion 22 having a diameter of 12 mm and a depth of 1 mm is formed in the center of the cathode in a region of the first cathode 21 facing the plasma generation chamber 100. In this embodiment, the circular recess portion 22 is provided, and the shape of the recess portion 22 is not limited to a circular shape and may be a polygonal shape. However, from the viewpoint of manufacturability, a circular shape as shown in the figure is preferable.

FIG. 5 shows a shape of the anode 23. FIG. 5 shows a plan view (upper view) of the anode 23 viewed from the ion beam extraction hole side and a cross-sectional view (lower view) of the anode 23 along an A-A line in the plan view. The anode 23 is formed of an electrically conductive non-magnetic material such as aluminum and includes a protruding region 25a having, for example, a disk shape at an end portion of a cylindrical region 35a on the first cathode 21 side to expand a region where the recess portion 22 of the first cathode 21 and the anode 23 face each other. As shown in FIG. 3, the anode 23 is fitted into the insulator 26, the outer surface of the anode 23 is in contact with the inner surface of the insulator 26, and the inner surface of the anode 23 functions as the plasma generation chamber 100. The anode pin passing through the anode pin through hole 103 of the first cathode 21 is pressed against the protruding region 25a provided on a side where the anode 23 faces the recess portion 22 of the first cathode 21. Accordingly, the anode 23 is fixed to be pressed against the second cathode 12 via the insulator 26. In this embodiment, the protruding region 25a facing the recess portion 22 of the first cathode 21 is formed in a disk shape, and the shape of the protruding region 25a is not limited to a circular shape and may be a polygonal shape.

FIG. 6 shows a shape of the insulator 26. FIG. 6 shows a plan view (upper view) of the insulator 26 viewed from the ion beam extraction hole side and a cross-sectional view (lower view) of the insulator 26 along an A-A line in the plan view. The insulator 26 is formed of an electrically insulating non-magnetic material such as ceramics. Similarly to the anode 23, the insulator 26 includes a protruding region 25b having, for example, a disk shape at an end portion of a cylindrical region 35b on the first cathode 21 side, that is, on a side where the protruding region 25a of the anode 23 is provided. With this structure, the protruding region 25a at the end portion of the anode 23 and the permanent magnet 14 are electrically insulated. As shown in FIG. 3, the long-term stability of the ion gun 1 is improved by covering the permanent magnet 14 so as not to be exposed to the plasma generation chamber 100 by the protruding region 25b.

FIG. 7 shows analysis results of potential distribution inside the ion gun of the embodiment shown in FIG. 3 and the comparative example shown in FIG. 2. An analysis result 401 is the analysis result for the structure shown in FIG. 3, and an analysis result 402 is the analysis result for the structure shown in FIG. 2, both of which are the results obtained by performing electric field strength analysis using a finite element-based physics simulator. In FIG. 7, a high potential region and a low potential region are shown darkly, and an intermediate potential region is shown brightly. As shown in the analysis result 401, a strong electric field is generated in the entire region where the recess portion 22 of the first cathode 21 and the protruding region 25a of the anode 23 face each other; by this amount, a region where electrons can be supplied from the first cathode 21 is greatly expanded as compared with the structure of the comparative example shown in the analysis result 402. Accordingly, the supply amount of electrons generated in the plasma generation chamber 100 can be remarkably increased, and a high ion saturation current can be achieved.

FIG. 8A shows electron density distribution inside the plasma generation chamber 100 of the embodiment shown in FIG. 3, and FIG. 8B shows electron density distribution inside the plasma generation chamber 100 of the comparative example shown in FIG. 2. FIGS. 8A and 8B are obtained by plotting results of electric field strength analysis using a finite element-based physics simulator. Horizontal axes in FIGS. 8A and 8B match the scale shown in FIG. 7, and the electron density is plotted with a surface of the first cathode as a zero point and a central axis of the ion gun directed at the ion beam extraction hole 101a. As a result, it can be seen that, in the case of the structure in the embodiment shown in FIG. 3, the electron density is $8.8 \times 10^{15}$ l/m³, which increases by about 30% compared to $6.7 \times 10^{15}$ l/m³ in the case of the structure of the comparative example shown in FIG. 2.

Hereinafter, a modification example of the ion gun according to the present embodiment will be described. FIG. 9 is a cross-sectional view of a configuration of an ion gun according to the present embodiment (a second embodiment). In the following embodiments, since application mechanisms of a discharge voltage and an acceleration voltage are the same, the description thereof will be omitted. In this embodiment, a bottom surface of a recess portion formed in the first cathode 31 is of a shape in which the depth of the recess portion at the central portion is larger than that at the peripheral portion. Except for the above point, the ion gun has the same structural features as those of the first embodiment (FIG. 3).

FIG. 10 shows a shape of the first cathode 31. FIG. 10 shows a plan view (upper view) of the first cathode 31 viewed from an ion beam extraction hole side and a cross-sectional view (lower view) of the first cathode 31 along an A-A line shown in the plan view. The first cathode 31 is formed of a conductive magnetic material such as pure iron and has a disk shape. The first cathode 31 is provided with the cathode fixing holes 102 for fixing the cathode to the ion gun base 18, and the anode pin through hole 103 through which an anode pin passes. In a region of the first cathode 31 facing the plasma generation chamber 100, a recess portion 32 having a diameter of 12 mm is formed in the center of the cathode. In this embodiment, a bottom surface of the recess portion 32 has a conical shape, and the recess portion 32 has an inclined surface in which the depth at the central portion is 2 mm and the depth at the peripheral portion is 1 mm. The shape of the bottom surface is not limited to the conical shape, and for example, the central portion of the bottom surface may have a flat shape. In this way, by providing the inclined surface in the recess portion 32, the surface area of the first cathode 31 in which electrons are generated can be increased, and the supply amount of electrons generated in the plasma generation chamber 100 can be increased.

FIG. 11 is a cross-sectional view of a configuration of an ion gun according to the present embodiment (a third embodiment). In this embodiment, irregularities are formed on a bottom surface of a recess portion formed in the first cathode 41. Except for the above point, the ion gun has the same structural features as those of the first embodiment (FIG. 3).

FIG. 12 shows a shape of the first cathode 41. FIG. 12 shows a plan view (upper view) of the first cathode 41 viewed from an ion beam extraction hole side and a cross-sectional view (lower view) of the first cathode 41 along an A-A line shown in the plan view. The first cathode 41 is formed of a conductive magnetic material such as pure iron and has a disk shape. The first cathode 41 is provided with the cathode fixing holes 102 for fixing the cathode to the ion gun base 18, and the anode pin through hole 103 through which an anode pin passes. In a region of the first cathode 41 facing the plasma generation chamber 100, a recess portion 42 having a diameter of 12 mm and a depth of 1 mm is formed in the center of the cathode. Further, circumferential slits having a width of 0.4 mm and a depth of 1 mm are formed on a bottom surface of the recess portion 42. By increasing the surface area of the cathode, the supply amount of electrons generated in the plasma generation chamber 100 can be further increased. In this embodiment, although an example in which the circumferential slits are formed on the bottom surface of the recess portion 42 is shown as the irregularities, the shape of the slit is not limited to a circular shape, and may be a polygonal shape or a lattice shape.

FIG. 13 is a cross-sectional view of a configuration of an ion gun according to the present embodiment (a fourth embodiment). In this embodiment, an opening, which is connected to a cylindrical region, of a protruding region of an anode 33 is formed in a shape having an inclined surface in which an inner diameter thereof increases as the distance from the cylindrical region increases. A bottom surface of a recess portion formed in a first cathode 51 is formed in a shape having a protrusion portion inclined from an outer peripheral portion toward a central portion along the shape of the protruding region of the anode 33. By increasing the area where the first cathode 51 and the anode 33 face each other at a short distance at an end portion enlarged by the protruding region, the supply amount of electrons generated in the plasma generation chamber 100 can be further increased. Except for the above point, the ion gun has the same structural features as those of the first embodiment (FIG. 3).

FIG. 14 is a cross-sectional view of a configuration of an ion gun according to the present embodiment (a fifth embodiment). In this embodiment, as in the fourth embodiment, a disk shape end portion of the anode 33 facing a first cathode 61 is inclined from an outer peripheral portion to a central portion. On the other hand, a bottom surface of a recess portion formed in the first cathode 61 is flattened. For this reason, the distance at which the first cathode 51 and the anode 33 face each other at the enlarged end portion is increased as compared with the structure of the fourth embodiment, the space connected to the plasma generation chamber 100 can be increased accordingly, and the electrons generated at the enlarged end portion can be easily introduced into the plasma generation chamber 100. Except for the above point, the ion gun has the same structural features as those of the first embodiment (FIG. 3).

FIG. 15 is a cross-sectional view of a configuration of an ion gun according to the present embodiment (a sixth embodiment). In this embodiment, an anode 43 is formed in such a shape that an inner diameter of an opening, which is connected to a cylindrical region, of a protruding region of the anode 43 increases as the distance from the cylindrical region increases, and an outer diameter of the protruding region of the anode 43 also increases according to an inner diameter of the opening. In accordance with this shape, an insulator 36 electrically insulating a permanent magnet 24 and the anode 43 is formed in such a shape that an inner diameter of an opening, which is connected to a cylindrical region, of a protruding region increases in accordance with the outer diameter of the protruding region of the anode 43, and an outer diameter of the protruding region of the insulator 36 also increases in accordance with the inner diameter of the opening. In accordance with the shape of the insulator 36, the permanent magnet 24 is provided with, on an inner wall thereof, an inclined surface whose inner diameter increases in accordance with the outer diameter of the protruding region of the insulator 36. A bottom surface of a recess portion formed in a first cathode 71 is formed in a shape having a protrusion portion inclined from an outer peripheral portion toward a central portion in accordance with the shape of the protruding region of the anode 43. Similar to the structure of the fourth embodiment, at the enlarged end portion, the area in which the first cathode 71 and the anode 43 face each other at a short distance can be increased, and the height of the outer peripheral portion of the first cathode 71 may be designed to be lower than that of the first cathode 51, so that the ion gun may be formed more compactly. Except for the above point, the ion gun has the same structural features as those of the first embodiment (FIG. 3).

FIG. 16 is a cross-sectional view of a configuration of an ion gun according to the present embodiment (a seventh embodiment). In this embodiment, similarly to the sixth embodiment, protruding regions of the anode 43 and the insulator 36 are inclined toward an outer peripheral side to increase the outer diameter, and the permanent magnet 24 is provided with an inclined surface for increasing the inner diameter on an inner wall in accordance with the shape of the projecting region of the insulator 36. Further, a bottom surface of a recess portion formed in a first cathode 81 is flattened. For this reason, the distance at which the first cathode 81 and the anode 43 face each other at the enlarged end portion is increased as compared with the structure of the sixth embodiment, the space connected to the plasma generation chamber 100 can be increased accordingly, and the electrons generated at the enlarged end portion can be easily introduced into the plasma generation chamber 100. Except for the above point, the ion gun has the same structural features as those of the first embodiment (FIG. 3).

FIG. 17 is a cross-sectional view of a configuration of an ion gun according to the present embodiment (an eighth embodiment). In this embodiment, a non-magnetic material 19 is disposed in a recess portion formed in a first cathode 91. Accordingly, it is possible to prevent non-magnetic particles sputtered by the collision of cations generated inside the ion gun from being stacked in a needle shape on the anode 23 to cause an abnormal discharge. For example, tungsten, molybdenum, titanium, chromium, tantalum, or the like may be applied to the non-magnetic material. Except for the above point, the ion gun has the same structural features as those of the first embodiment (FIG. 3).

Since redeposition generated from a metal cathode is easily oxidized, the redeposition is oxidized when adhering to an anode, which causes a decrease in the conductivity of the anode. When the conductivity of the anode decreases, problems such as charging and unstable discharge occur. Accordingly, the non-magnetic material 19 disposed in the recess portion of the first cathode 91 needs to be a material having both conductivity and ion resistance, and a component formed of a hard metal material as exemplified is effective. Although the "sputtering yield" is generally used for defining the sputtering amount, the volume to be actually sputtered may be expressed as a "ratio obtained by multiplying the sputtering yield by the crystal mole density". In the case of titanium, a sputtering molar ratio is 0.322 mol/cc, which is a minimum molar ratio as a metal material. By the configuration of the ion gun as shown in FIG. 17, the number of ions emitted from the ion gun can be increased, deformation and contamination of the first cathode 91 and the non-magnetic material 19 can be reduced, a stable ion current can be obtained, and the life of these components can be elongated as compared with the related art.

Further, as the non-magnetic material 19 disposed in the recess portion formed in the first cathode 91, for example, graphite carbon, single crystal graphite, or highly oriented pyrolytic graphite (HOPG) may also be applied. Graphite carbon, which is a conductive material, has a sputter molar volume ratio of 0.15 mol/cc, which is even less than that of titanium. Accordingly, the sputter molar volume from the non-magnetic material 19 formed in the recess portion of the first cathode 91 can be further reduced. As a result, the volume of redeposition adhering to the anode 23 is also reduced, so that short circuits between the electrodes are less likely to occur, and the maintenance cycle of the ion gun can be extended. Further, since graphite carbon has excellent oxidation resistance, even when the sputtered particles of graphite carbon reattach to the anode 23, it is less likely to be oxidized as compared with the case of a metal material. Accordingly, even when the redeposition adheres to the anode 23, problems such as charging caused by the oxidation of the redeposition are less likely to occur, and cleaning of the ion gun for the purpose of preventing charging may be basically unnecessary.

FIG. 18 shows results of comparing the electron density distribution inside the plasma generation chamber 100 as an effect of the present embodiment. An item on the horizontal axis represents the structure of the ion gun, and the electron density distribution in the structure in the related art shown in FIG. 2 is shown as a comparative example. FIG. 18 shows the electron density distribution in the structures of the first embodiment to the seventh embodiment shown in FIGS. 3, 9, 11, 13, 14, 15, and 16. FIG. 18 is obtained by plotting the results of electric field strength analysis using a physics simulator. As a result, it can be seen that, in the structure of this embodiment, the electron density is improved from about 3% to 61% compared to $6.7 \times 10^{15}$ $1/m^3$ of the structure in the related art shown as the comparative example. Accordingly, the ion flow in the plasma generation chamber 100 is increased, and an ion source can obtain a sufficient ion saturation current value corresponding to the high space charge limiting current value, and as a result, the number of ions emitted from the ion gun can be increased.

FIG. 19 is a cross-sectional view of a configuration of an ion gun according to the present embodiment (a ninth embodiment). In this embodiment, a permanent magnet 404 having an inner diameter greater than an inner diameter of the permanent magnet 14 is disposed at an interface where the first cathode 111 and the permanent magnet 14 are connected. Accordingly, no recess portion is necessary in a surface region of the first cathode 111 where the first cathode 111 is connected to the permanent magnet 14, and a region where the first cathode 111 face the anode 23 is enlarged by providing a disk shape protruding region at an end portion of the anode 23 facing the first cathode 111. Similarly to the anode 23, the insulator 26 that electrically insulates the first cathode 111, the second cathode 12, the permanent magnet 14, and the permanent magnet 404 from the anode 23 is coated so as not to expose the permanent magnet 14 to the plasma generation chamber 100 by a disk shape protruding region provided at an end portion on the first cathode 111 side to expand the area, thereby improving the reliability of the ion gun.

FIG. 20 is a cross-sectional view of a configuration of an ion gun according to the present embodiment (a tenth embodiment). In this embodiment, a third cathode 405 having an inner diameter greater than an inner diameter of the permanent magnet 14 is disposed at the interface where the first cathode 111 and the permanent magnet 14 are connected. Accordingly, no recess portion is necessary in the surface region of the first cathode 111 where the first cathode 111 is connected to the permanent magnet 14, and the region where the first cathode 111 faces the anode 23 is enlarged by providing a disk shape protruding region at an end portion of the anode 23 facing the first cathode 111. Similarly to the anode 23, the insulator 26 that electrically insulates the first cathode 111, the second cathode 12, the third cathode 405, and the permanent magnet 14 from the anode 23 is coated so as not to expose the permanent magnet 14 to the plasma generation chamber 100 by a disk shape protruding region provided at an end portion on the first cathode 111 side to expand the area, thereby improving the reliability of the ion gun.

The invention is not limited to the embodiments described above, and includes various modifications. For example, the embodiments described above have been described for easy understanding of the invention, and the invention is not necessarily limited to those including all configurations described above. A part of a configuration according to an embodiment may be replaced with a configuration according to another embodiment, and the configuration according to the other embodiment can be added to the configuration according to the embodiment. For example, instead of the first cathode provided with the recess portion according to the third embodiment to the seventh embodiment, a combination of the first cathode and the permanent magnets of the ninth embodiment or a combination of the first cathode and the third cathode according to the tenth embodiment may be used to constitute a similar ion gun.

REFERENCE SIGN LIST 1, 10 ion gun
2 ion beam
3 ion gun controller
4 vacuum chamber
5 vacuum exhaust system
6 sample
7 sample table
8 sample stage
9 sample stage driver
11, 21, 31, 41, 51, 61, 71, 81, 91, 111 first cathode
12 second cathode
13, 23, 33, 43 anode
14, 24, 404 permanent magnet
15 acceleration electrode
16, 26, 36 insulator
17 cathode ring
18 ion gun base
19 non-magnetic material
22, 32, 42 recess portion
25a, 25b protruding region
35a, 35b cylindrical region
100 plasma generation chamber
101a, 101b ion beam extraction hole
102 cathode fixing hole
103 anode pin through hole
200 gas supply mechanism
201 gas source
301 discharge power supply
302 acceleration power supply
401, 402 analysis result
405 third cathode

The invention claimed is:

1. An ion gun comprising:
a first cathode formed in a disk shape;
a second cathode formed in a disk shape and provided with an ion beam extraction hole;
a first permanent magnet disposed between the first cathode and the second cathode and formed in a cylindrical shape;
an anode provided with a cylindrical region and a protruding region provided at one end of the cylindrical region; and
an insulator electrically insulating the anode from the first cathode, the second cathode, and the first permanent magnet that are electrically connected, wherein
the cylindrical region of the anode is disposed inside an inner diameter position of the first permanent magnet, and
the protruding region of the anode is disposed beyond the inner diameter position of the first permanent magnet and faces the first cathode.

2. The ion gun according to claim 1, wherein
a plasma generation chamber is formed between the first cathode and the second cathode, in which ions are generated by colliding electrons with a gas supplied from outside, and
the first permanent magnet is coated with the insulator such that the first permanent magnet is not exposed to the plasma generation chamber.

3. The ion gun according to claim 2, wherein
the insulator includes a cylindrical region and a protruding region provided at an end of the cylindrical region,
the cylindrical region of the insulator is disposed inside an inner diameter position of the first permanent magnet,
the cylindrical region of the anode is fitted into the cylindrical region of the insulator, and
the protruding region of the insulator covers the first permanent magnet beyond the protruding region of the anode.

4. The ion gun according to claim 1, wherein
the first cathode includes, on a surface facing the protruding region of the anode, a recess portion having a diameter smaller than an outer diameter of the first permanent magnet and larger than an inner diameter of the first permanent magnet.

5. The ion gun according to claim 4, wherein
a depth of the recess portion of the first cathode at a central portion is greater than a depth of the recess portion at a peripheral portion.

6. The ion gun according to claim 5, wherein
the recess portion of the first cathode is formed in a conical shape.

7. The ion gun according to claim 1, wherein
the first cathode is provided with irregularities formed on a surface facing the protruding region of the anode.

8. The ion gun according to claim 7, wherein
the irregularities are formed by circumferential, polygonal, or lattice-shaped slits in the first cathode.

9. The ion gun according to claim 1, wherein
an opening provided in the protruding region of the anode is connected to the cylindrical region of the anode, and has an inclined surface whose inner diameter increases as a distance from the cylindrical region of the anode increases.

10. The ion gun according to claim 9, wherein the first cathode includes, on a surface facing the protruding region of the anode, a protrusion portion having an inclined surface corresponding to the opening of the protruding region of the anode.

11. The ion gun according to claim 3, wherein
an opening provided in the protruding region of the anode is connected to the cylindrical region of the anode, has an inner diameter increasing as a distance from the cylindrical region of the anode increases, and an outer diameter of the protruding region of the anode expands according to the inner diameter of the opening,
an opening provided in the protruding region of the insulator is connected to the cylindrical region of the insulator, has an inner diameter increasing according to the outer diameter of the protruding region of the anode, and an outer diameter of the protruding region of the insulator expands according to the inner diameter of the opening, and
an inner wall of the first permanent magnet has an inclined surface whose inner diameter increases according to the outer diameter of the protruding region of the insulator.

12. The ion gun according to claim 11, wherein
the first cathode includes, on a surface facing the protruding region of the anode, a protrusion portion having an inclined surface corresponding to the opening of the protruding region of the anode.

13. The ion gun according to claim 1, wherein
a non-magnetic material is disposed on a surface of the first cathode facing the protruding region of the anode.

14. The ion gun according to claim 13, wherein
the non-magnetic material includes at least one of tungsten, molybdenum, titanium, chromium, and tantalum.

15. The ion gun according to claim 13, wherein
the non-magnetic material includes at least one of graphitic carbon, single crystal graphite, and highly oriented pyrolytic graphite.

16. The ion gun according to claim 1, wherein
a second permanent magnet having an inner diameter greater than an inner diameter of the first permanent magnet is disposed between the first cathode and the first permanent magnet, and
the insulator electrically insulates the anode from the first cathode, the second cathode, the first permanent magnet, and the second permanent magnet that are electrically connected.

17. The ion gun according to claim 1, wherein
a third cathode having an inner diameter greater than an inner diameter of the first permanent magnet is disposed between the first cathode and the first permanent magnet, and
the insulator electrically insulates the anode from the first cathode, the second cathode, the third cathode, and the first permanent magnet that are electrically connected to each other.

18. An ion milling device comprising:
the ion gun according to claim 1;
a vacuum chamber whose atmospheric pressure is controlled by a vacuum exhaust system; and
a sample stage disposed in the vacuum chamber and configured to hold a sample, wherein
the sample is processed by being irradiated with an ion beam from the ion gun.

19. The ion milling device according to claim 18, further comprising:
a gas supply mechanism connected to the ion gun; and
an ion gun controller configured to control the ion gun, wherein
the ion gun includes an acceleration electrode provided with an ion beam extraction hole,
the gas supply mechanism supplies a gas to be ionized into the ion gun, and
the ion gun controller applies a discharge voltage between the first cathode as well as the second cathode and the anode to generate a glow discharge, and applies an acceleration voltage between the second cathode and the acceleration electrode, thereby accelerating ions generated by collision between electrons generated by the glow discharge and the gas and emitting the ions from the ion beam extraction hole of the acceleration electrode.

* * * * *